(12) United States Patent
Madan et al.

(10) Patent No.: US 9,013,225 B2
(45) Date of Patent: Apr. 21, 2015

(54) RF SWITCHES HAVING INCREASED VOLTAGE SWING UNIFORMITY

(71) Applicant: Skyworks Solutions, Inc., Woburn, MA (US)

(72) Inventors: Anuj Madan, Cambridge, MA (US); Hanching Fuh, Allston, MA (US); Fikret Altunkilic, North Andover, MA (US); Guillaume Alexandre Blin, Carlisle, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 13/936,181

(22) Filed: Jul. 6, 2013

(65) Prior Publication Data

US 2014/0218098 A1    Aug. 7, 2014

Related U.S. Application Data

(60) Provisional application No. 61/760,561, filed on Feb. 4, 2013.

(51) Int. Cl.
*H04B 1/48* (2006.01)
*H03K 17/16* (2006.01)
*H01L 25/00* (2006.01)

(52) U.S. Cl.
CPC ............. *H03K 17/162* (2013.01); *H01L 25/50* (2013.01); *H04B 1/48* (2013.01); *H01L 2924/0002* (2013.01)

(58) Field of Classification Search
CPC ................................. H04B 1/48; H03K 17/693

USPC ........... 327/379, 99, 108, 409, 408, 427, 434, 327/436; 455/78, 83

See application file for complete search history.

(56) References Cited

U.S. PATENT DOCUMENTS

| | | | |
|---|---|---|---|
| 4,255,756 A | 3/1981 | Shimotori et al. | |
| 5,382,826 A | 1/1995 | Mojaradi et al. | |

(Continued)

FOREIGN PATENT DOCUMENTS

JP    2005-515657 A    5/2005

OTHER PUBLICATIONS

International Search Report and Written Opinion issued on Dec. 23, 2013 in connection with corresponding PCT Application No. PCT/US2013/049500.

*Primary Examiner* — Jung Kim

(74) *Attorney, Agent, or Firm* — Fernando Hale & Chang LLP

(57) ABSTRACT

Radio-frequency (RF) switch circuits are disclosed providing uniform voltage swing across a transmit switch for improved device performance. A switching circuit includes a switch having field effect transistors (FETs) defining an RF signal path between the input port and the output port, the switch configured to be capable of being in a first state corresponding to the input and output ports being electrically connected so as to allow passage of the RF signal therebetween, and a second state corresponding to the input and output ports being electrically isolated. The switching circuit includes a voltage distribution circuit configured to reduce voltage distribution variation across the switch, including one or more elements coupled to a selected body node of one or more FETs so as to reduce voltage distribution variation across the switch when the switch is in the first state and encountered by an RF signal at the input port.

8 Claims, 11 Drawing Sheets

(56) References Cited

U.S. PATENT DOCUMENTS

| | | | |
|---|---|---|---|
| 5,644,266 | A | 7/1997 | Chen et al. |
| 5,748,016 | A | 5/1998 | Kurosawa |
| 5,753,955 | A | 5/1998 | Fechner |
| 5,969,564 | A | 10/1999 | Komatsu et al. |
| 6,281,737 | B1 | 8/2001 | Kuang et al. |
| 6,989,706 | B2 | 1/2006 | Sekigawa et al. |
| 7,095,266 | B2 | 8/2006 | Miske |
| 7,236,044 | B2 | 6/2007 | Talwalkar et al. |
| 7,385,436 | B2 | 6/2008 | Itoh et al. |
| 7,619,462 | B2 | 11/2009 | Kelly et al. |
| 7,659,765 | B2 | 2/2010 | Ito |
| 7,659,770 | B2 | 2/2010 | Teraguchi et al. |
| 7,683,433 | B2 | 3/2010 | Kapoor et al. |
| 7,890,063 | B2 | 2/2011 | Ahn et al. |
| 7,898,297 | B2 | 3/2011 | Kapoor et al. |
| 7,910,993 | B2 | 3/2011 | Brindle et al. |
| 7,928,794 | B2 | 4/2011 | Balboni |
| 8,054,143 | B2 | 11/2011 | Takahashi |
| 8,441,304 | B2 | 5/2013 | Kinoshita et al. |
| 8,461,903 | B1 | 6/2013 | Granger-Jones |
| 8,514,008 | B2 | 8/2013 | Yan et al. |
| 8,723,260 | B1 | 5/2014 | Carroll et al. |
| 8,779,840 | B2 * | 7/2014 | Sugiura et al. ............. 327/427 |
| 2005/0239415 | A1 * | 10/2005 | Sagae et al. ................ 455/78 |
| 2006/0012407 | A1 | 1/2006 | Bechman et al. |
| 2006/0199563 | A1 | 9/2006 | Kelly et al. |
| 2008/0272824 | A1 | 11/2008 | Fu et al. |
| 2010/0060377 | A1 | 3/2010 | Takahashi |
| 2011/0025403 | A1 | 2/2011 | Cassia |
| 2011/0148501 | A1 | 6/2011 | Granger-Jones et al. |
| 2011/0169550 | A1 | 7/2011 | Brindle et al. |
| 2013/0009725 | A1 | 1/2013 | Heaney et al. |
| 2014/0002171 | A1 | 1/2014 | Nohra |

\* cited by examiner

RF SWITCHES HAVING INCREASED VOLTAGE SWING UNIFORMITY

RELATED APPLICATION

This application claims the benefit of priority under 35 U.S.C. §119(e) of U.S. Provisional Application No. 61/760,561, filed on Feb. 4, 2013, and entitled "RF Switches Having Increased Voltage Swing Uniformity," the disclosure of which is hereby incorporated by reference in its entirety.

BACKGROUND

1. Field

The present disclosure generally relates to the field of electronics, and more particularly, to radio-frequency switches.

2. Description of Related Art

Radio-frequency (RF) switches, such as transistor switches, can be used to switch signals between one or more poles and one or more throws. Transistor switches, or portions thereof, can be controlled through transistor biasing and/or coupling. Design and use of bias and/or coupling circuits in connection with RF switches can affect switching performance.

SUMMARY

In some implementations, the present disclosure relates to a switching circuit that includes an input port configured to receive a radio-frequency (RF) signal and an output port configured to output the RF signal. The switching circuit may also include one or more field effect transistors (FETs) defining an RF signal path between the input port and the output port, each FET having a source, a drain, a gate node, and a body node. The switch may be configured to be capable of being in first and second states, the first state corresponding to the input and output ports being electrically connected so as to allow passage of the RF signal therebetween, the second state corresponding to the input and output ports being electrically isolated. The switching circuit may further include a voltage distribution circuit configured to reduce voltage distribution variation across the switch, the voltage distribution circuit including one or more elements coupled to a selected body node of one or more FETs to reduce voltage distribution variation across the switch when the switch is in the first state and encountered by an RF signal at the input port.

In some embodiments, the one or more elements coupled to the selected body node of one or more FETs may include a capacitive element. The one or more elements coupled to the selected body node of one or more FETs may include a resistive element. Further, in some embodiments the one or more elements coupled to the selected body node of one or more FETs may include a capacitive element connected in series to a resistive element.

In some embodiments, the voltage distribution circuit may include a feed-forward capacitive element configured to couple the RF signal path to the body node of an FET defining the RF signal path, including the body node of a first FET defining the RF signal path. In some embodiments, the voltage distribution circuit includes a feed-forward capacitive element connected in series to a feed-forward resistive element, configured to couple the RF signal path to the body node of an FET defining the RF signal path.

In some embodiments, a voltage distribution circuit may include a resistive element coupled to the gate node of an FET defining the RF signal path to thereby enable floating of the gate node of the FET. A resistive element may also be coupled to the body node of an FET defining the RF signal path to thereby enable floating of the body node of the FET.

According to some implementations, the present disclosure relates to an integrated circuit (IC) formed on a die. The IC may include a switch having one or more field effect transistors (FETs) defining an RF signal path between an input port and an output port, each FET having a body node. The switch may be configured to be capable of being in ON and OFF states. In some embodiments, a voltage distribution circuit may be coupled to the switch and configured to reduce voltage distribution variation across the switch. The voltage distribution circuit may include one or more elements coupled to a selected body node of one or more FETs to reduce voltage distribution variation across the switch when the switch is in an ON state and is encountered by a respective RF signal at the input port.

In some embodiments, a transceiver circuit may be electrically connected to the switch and configured to process RF signals.

As taught in a number of implementations, the present disclosure relates to a packaged module for a radio-frequency (RF) device. The module includes a packaging substrate and an integrated circuit (IC) formed on a semiconductor die and mounted on the packaging substrate. The IC may include a switch having one or more field effect transistors (FET) defining an RF signal path between an input port and an output port, each FET having a body node, and the switch may be configured to be capable of being in ON and OFF states. A voltage distribution circuit may be coupled to the switch to reduce voltage distribution variation across the switch when the switch is in an ON state and encountered by a respective RF signal at the input port. In some embodiments, the voltage distribution circuit may include one or more elements coupled to a selected body node of one or more FETs defining the RF signal path.

In some embodiments, the packaged module may also include at least one connection configured to facilitate passage of signals to and from the switch. In some embodiments, the packaged module may also include packaging structure configured to provide protection for the switch.

In accordance with some implementations, the present disclosure relates to a wireless device. The wireless device may include at least one antenna configured to facilitate transmission and reception of radio-frequency (RF) signals. Further, the wireless device may also include a transceiver coupled to the antenna and configured to process radiofrequency (RF) signals. In some embodiments, the wireless device may include a switch having one or more field effect transistors (FETs) defining an RF signal path between an input port and an output port, each FET having a body node. Additionally, the switch may be configured to be capable of being in ON and OFF states. In some embodiments, a voltage distribution circuit may be coupled to the switch to reduce voltage distribution variation across the switch when the switch is in an ON state and encountered by an RF signal at the input port, the voltage distribution circuit including one or more elements coupled to a selected body node of one or more FETs defining the RF signal path.

In some embodiments, the wireless device may also include a receptacle configured to receive a battery and to provide electrical connection between the battery and the switch.

According to some implementations, the present disclosure relates to a method of fabricating a radio-frequency (RF) switching circuit. The method may include providing or forming a substrate, and forming on the substrate one or more FETs connected in series to define an RF signal path between an input end and an output end, each FET having a source, a drain, a gate node and a body node. The method may further include forming an element coupled to a selected body node of the one or more FETs connected in series to thereby provide reduced voltage distribution variation across the switching circuit.

In some embodiments, forming the element coupled to the selected body node of the one or more FETs includes forming a capacitive element. Forming the element coupled to the selected body node of the one or more FETs may also include forming a resistive element. In some embodiments, the substrate may include a semiconductor substrate. In some embodiments, the method may further include forming a feed-forward capacitive element from the RF signal path to the body node of a selected FET defining the RF signal path between the input end and the output end. The method may further include forming a resistive element coupled to the gate node of an FET defining the input end and the output end to thereby enable floating of the gate node of the FET. In some embodiments, the method may optionally include forming a resistive element coupled to the body node of an FET defining the input end and output end to thereby enable floating of the body node of the FET.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION OF SOME EMBODIMENTS

The headings provided herein, if any, are for convenience only and do not necessarily affect the scope or meaning of the claimed invention.

In some radiofrequency (RF) applications, it may be desirable to operate transmit switches under high power, including applications that operate under high mismatch. For example, GSM switches may operate under 35 dBm with 5:1 mismatch and switches used in antenna tuning may operate under 35 dBm with mismatch as high as 20:1.

In some RF applications, transmit switches operating under high power may experience uneven voltage distribution across the switch. Non-uniform voltage swing across a switch may produce adverse effects in device performance, including harmonic peaking, degradation in compression point and intermodulation distortion (IMD) performance of the switch.

Described herein are circuits, devices and methodologies for providing more uniform voltage swing across a transmit switch for improved device performance. In some implementations, increased uniformity in voltage swing across a transmit switch may result in improved compression point, harmonics and intermodulation distortion performance.

A switching device may be capable of being in a first state or a second state, such that the switching device may permit the transmission of RF signals between a first port and a second port while in one of the states. For example, when in a first state, such as an ON state, the RF switching device may enable transmission of RF signals from one port, such as an input port, to a second port, such as an output port. When in a second state, such as an OFF state, the RF switching device may prevent transmission of RF signals from an input port to an output port, thereby electrically isolating the input port from the output port.

Figure 1:
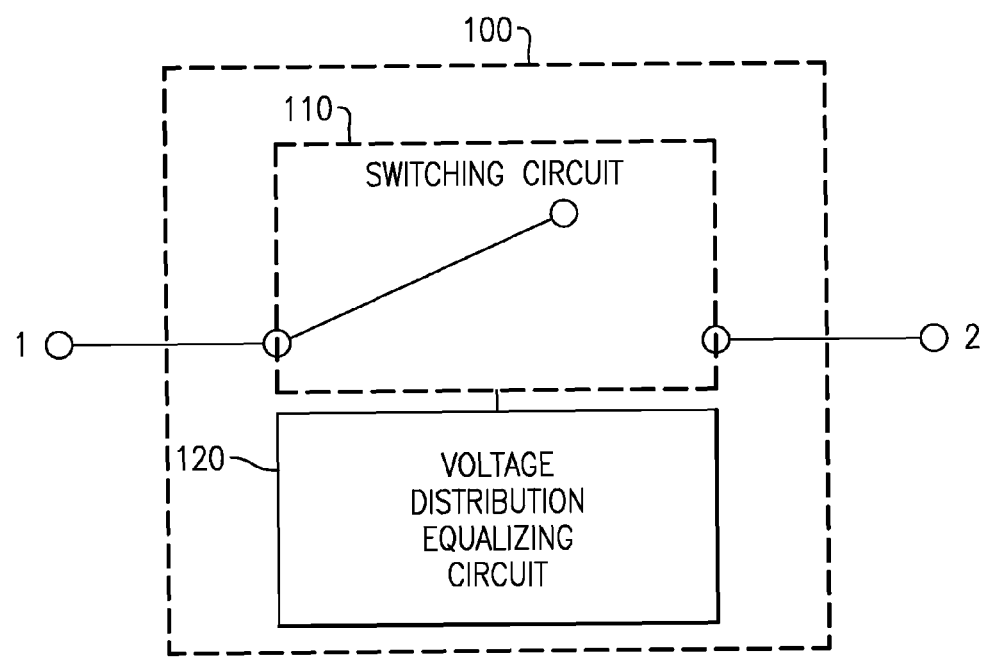
FIG. 1 schematically depicts a switching device including a switching circuit having a voltage distribution equalizing circuit, where the switching device is configured to allow passage of signals such as radio-frequency (RF) signals between first and second ports when in a first state.

Referring to FIG. 1, a switching device 100 having a first port and a second port may include a switching circuit 110. In some embodiments, the switching circuit 110 may further include a voltage distribution equalizing circuit 120. A voltage distribution equalizing circuit 120 may enable more uniform voltage distribution across a switching circuit 110 when the switching circuit is in an ON state, where an RF signal can be transmitted between an input port and an output port. In some embodiments, a voltage distribution equalizing circuit 120 may improve voltage distribution across a switching circuit 110 operating under high power. Increased uniformity in voltage swing across a switching circuit 110 may enable improved switching device 100 performance, including improvement in compression point, harmonics and intermodulation distortion performance.

Figure 2:
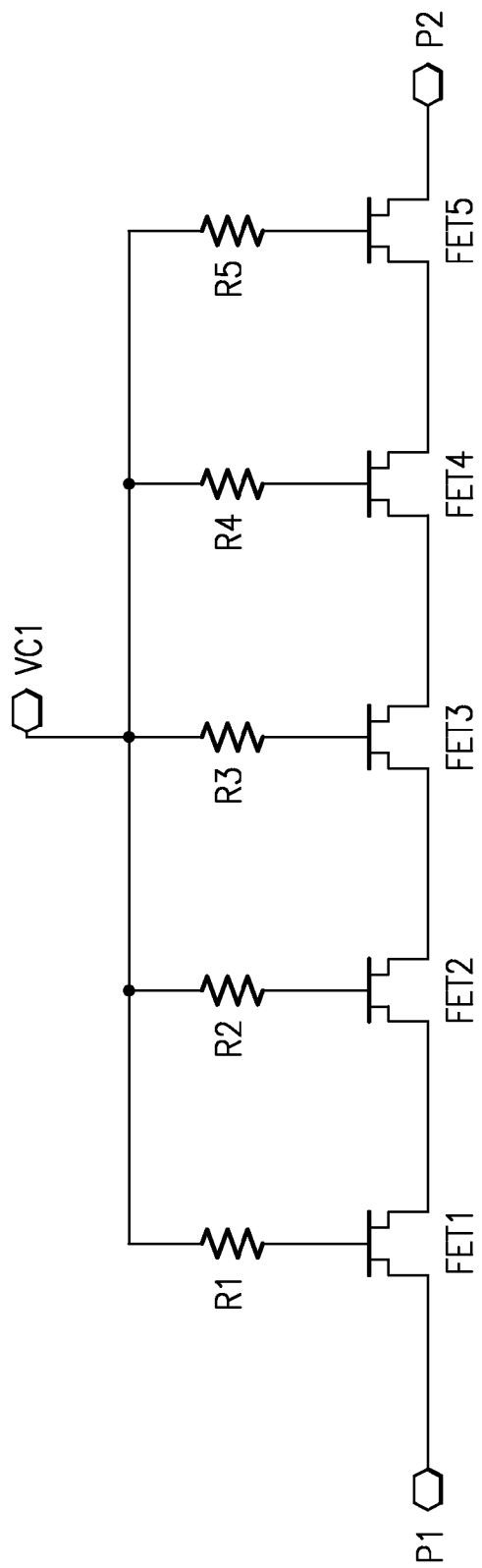
FIG. 2 shows a switching circuit including five FETs connected in series defining an RF signal path between an input end and an output end.

A switching device 100 may be implemented on a semiconductor substrate. In the semiconductor substrate context, a switching device 100 may include a switching circuit 110 having an FET stack. In some embodiments, an FET stack may include one or more FETs, where an FET has a source, a drain, a body node or a gate node. Additional FETs may be connected in series so as to define an RF signal path between an input end and an output end. In some embodiments, the FET stack is capable of being in a first or second state, such that when in a first state, for example an ON state, an RF signal can be transmitted from the input end to the output end, allowing the switching device 100 to transmit an RF signal from an input port to an output port. Meanwhile, when the FETs are in a second state, for example an OFF state, the FETs may prevent transmission of RF signals between the input end and the output end, thereby electrically isolating the input port from the output port of a switching device 100. FIG. 2 shows an example switching circuit having an FET stack that includes five FETs, FET1, FET2, FET3, FET4, and FET5, connected in series and defining an input end and an output end.

Increasing the FET stack height, or the number of FETs, of a switching circuit may improve switching device performance, including performance while operating under high power. However, a switching device may exhibit non-uniform voltage distribution across the switching device FET stack when the switching device is in an ON state and encountered by an RF signal at its input port. In some embodiments, a switching device may exhibit non-uniform voltage distribution across the switching device FET stack while operating under high power. Non-uniform voltage swing across an FET stack may adversely affect device performance, including harmonic peaking, intermodulation distortion (IMD), or compression point degradation.

A voltage distribution equalizing circuit may be coupled to a switching circuit to improve voltage swing uniformity across the switching circuit. A switching circuit having an FET stack may include a voltage distribution equalizing circuit that utilizes the body nodes of body contacted FETs for voltage compensation, thereby improving voltage distribution uniformity, or reducing voltage distribution variation, across the FET stack. In some embodiments, the voltage distribution equalizing circuit may include a body node voltage compensation technique. For example, a voltage distribution equalizing circuit of a switching circuit may include a capacitive element coupled to a body node of an FET in the FET stack. In some embodiments, a capacitive element is coupled to the body node of each FET in an FET stack. A voltage distribution equalizing circuit may also optionally include a resistive element coupled to a body node of an FET in the FET stack. In some embodiments, a resistive element is coupled to the body node of each FET in an FET stack. Further, the main RF signal may be coupled to the body node of an FET in an FET stack. In some embodiments, the RF signal is coupled to the body node of an FET in the FET stack through a feed-forward capacitive element Cfwd or a feed-forward resistive element Rfwd.

Figure 3:
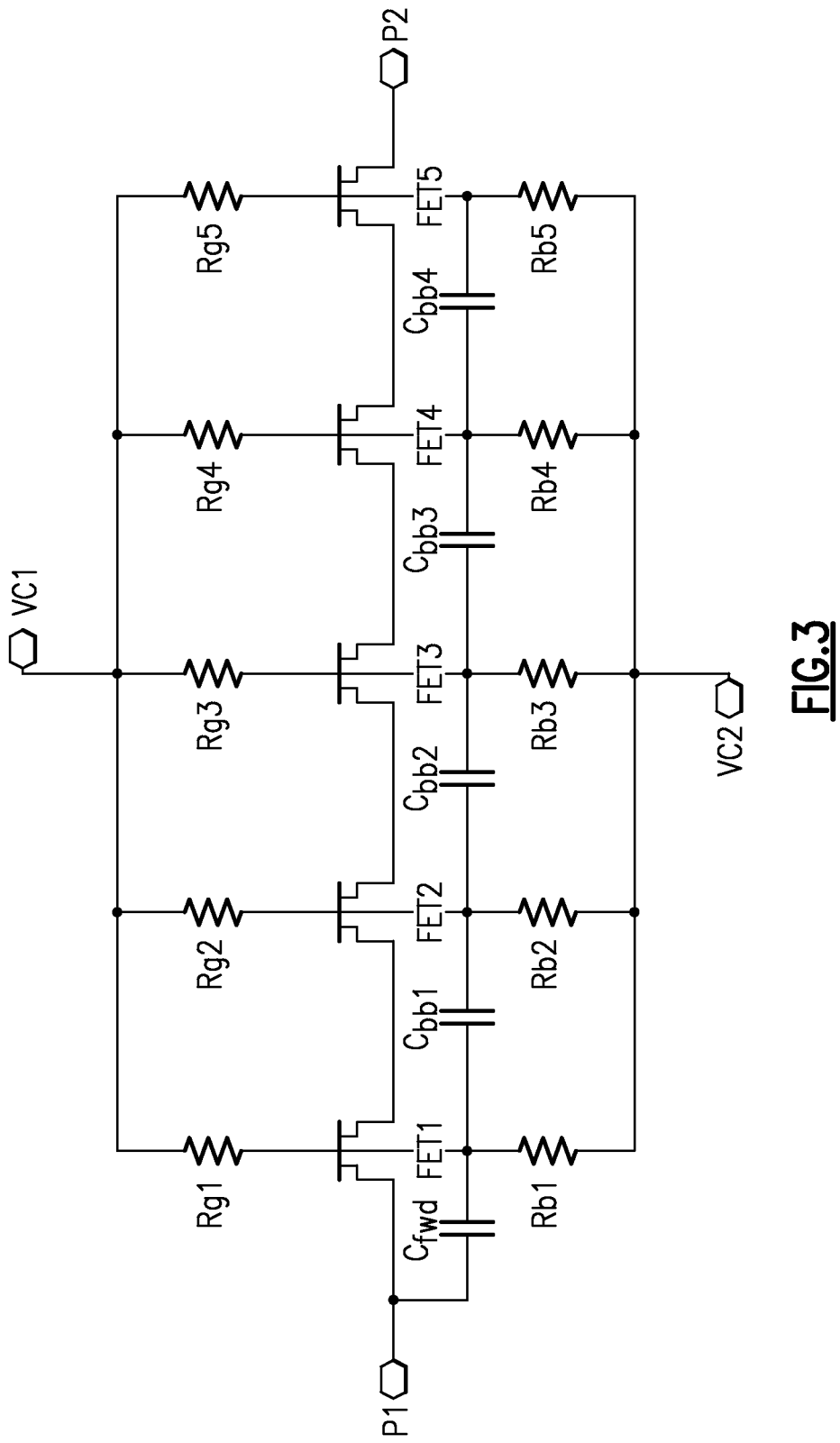
FIG. 3 shows a switching circuit including five FETs connected in series defining an input end and an output end, and including an implementation of the body node voltage compensation technique.

Referring to FIG. 3, the voltage distribution equalizing circuit of a switching circuit having an FET stack may optionally couple capacitive elements, Cbb, with the body nodes of FETs in an FET stack. In the example switching circuit of FIG. 3 including five FETs, FET1, FET2, FET3, FET4 and FET5, body nodes of FET1, FET2, FET3, FET4 and FET5 are coupled to capacitive elements Cbb1, Cbb2, Cbb3, and Cbb4. Capacitance values of capacitive elements Cbb may be scaled for improved switching device performance. The capacitance values of Cbb can be selected for increased voltage swing uniformity across the FET stack. In some embodiments, capacitance of the capacitive elements Cbb may also optionally have distinct values. Additionally, in some embodiments, capacitive elements Cbb can be implemented such that the capacitance of Cbb elements are in decreasing order, starting from a Cbb coupled to a first FET in an FET stack. Referring to the embodiment shown in FIG. 3, capacitance values of Cbb1, Cbb2, Cbb3, and Cbb4 may be distinct from one another. Capacitance values of Cbb1, Cbb2, Cbb3 or Cbb4 may each be selected to increase voltage distribution uniformity across FET1, FET2, FET3, FET4 and FET5. Further, elements Cbb may each have distinct capacitance values such that the capacitance value of Cbb1 is greater than that of Cbb2, the capacitance value of Cbb2 is greater than that of Cbb3, and the capacitance value of Cbb3 is greater than that of Cbb4.

In some embodiments, implementation of the body node voltage compensation technique in a switching circuit having an FET stack also includes a feed-forward capacitive element, Cfwd, that couples the main RF signal path to the body node. The RF signal path may be coupled to the body node through an FET in the FET stack. In an example embodiment, as shown in FIG. 3, a feed-forward capacitive element, Cfwd, can couple the RF signal path to the body node of a first FET in an FET stack. In such embodiments, the RF signal path is coupled through the source or drain of the first FET to the body node of the first FET. In the alternative, the RF signal path can be optionally coupled through the source or drain of another FET within the FET stack.

Furthermore, as shown in FIG. 3, the body node voltage compensation technique may also include resistive elements Rb, such as resistive elements Rb1, Rb2, Rb3, Rb4 and Rb5 in FIG. 3, implemented to float the body node of each FET in the FET stack. Meanwhile, resistive elements Rg, such as resistive elements Rg1, Rg2, Rg3, Rg4, Rg5 in FIG. 3, can be implemented to float the gate node of each FET in the FET stack.

Figure 4:
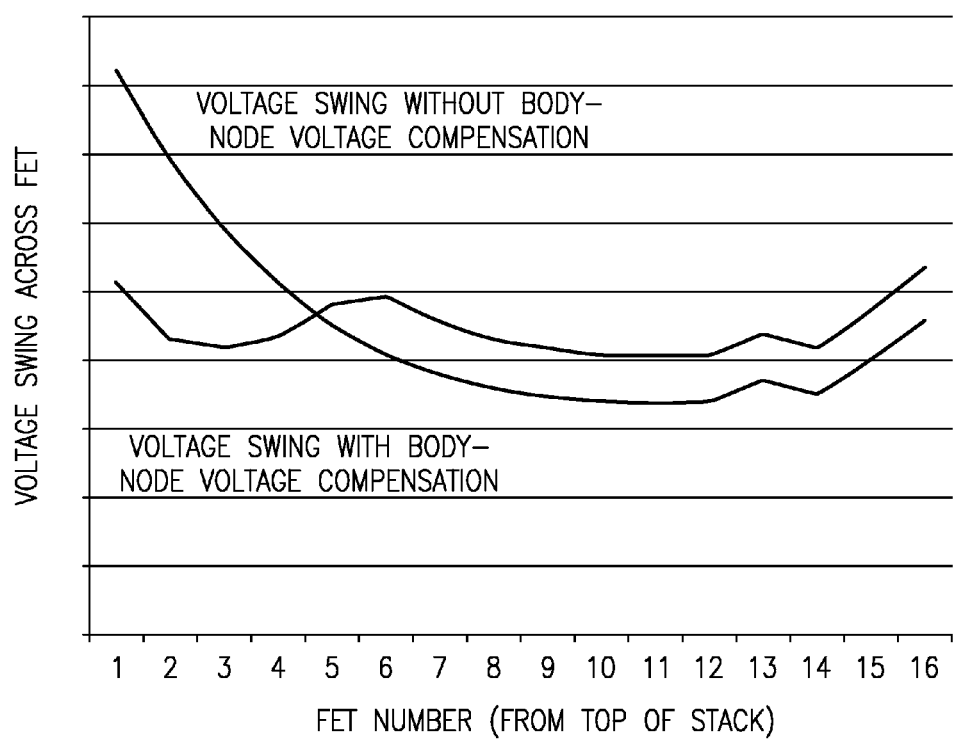
FIG. 4 graphs a comparison of voltage swing performance across the FETs of a switching circuit including an embodiment of the body node voltage compensation technique to that of a switching circuit that does not include the technique.

Improved voltage swing performance across an FET stack of a switching circuit implementing an embodiment of a voltage distribution equalizing circuit is shown in FIG. 4. FIG. 4 compares voltage swing performance across the FET stack of two example switching devices operating under 35 dBm and 20:1 mismatch. For the graphed comparison, the voltage swing performance across a switching device including an embodiment of the body node voltage compensation technique is compared to that of a switching device that does not include an embodiment of the body node voltage compensation technique. The switching device coupled to an embodiment of the body node voltage compensation technique has Cbb elements of distinct capacitance values, such that the capacitance of Cbb1 is larger than that of Cbb2, the capacitance of Cbb2 is larger than that of Cbb3, and so forth. Referring to FIG. 4, voltage swing across each FET of the example switching device including an embodiment of the body node voltage compensation technique remains within a significantly narrower range than that of the switching device which does not include a body node voltage compensation technique. Hence, the example switching device implementing an embodiment of the body node voltage compensation technique demonstrates increased voltage swing uniformity across the constituent FETs as compared to an example FET stack which does not implement a voltage distribution equalizing circuit.

Figure 5:
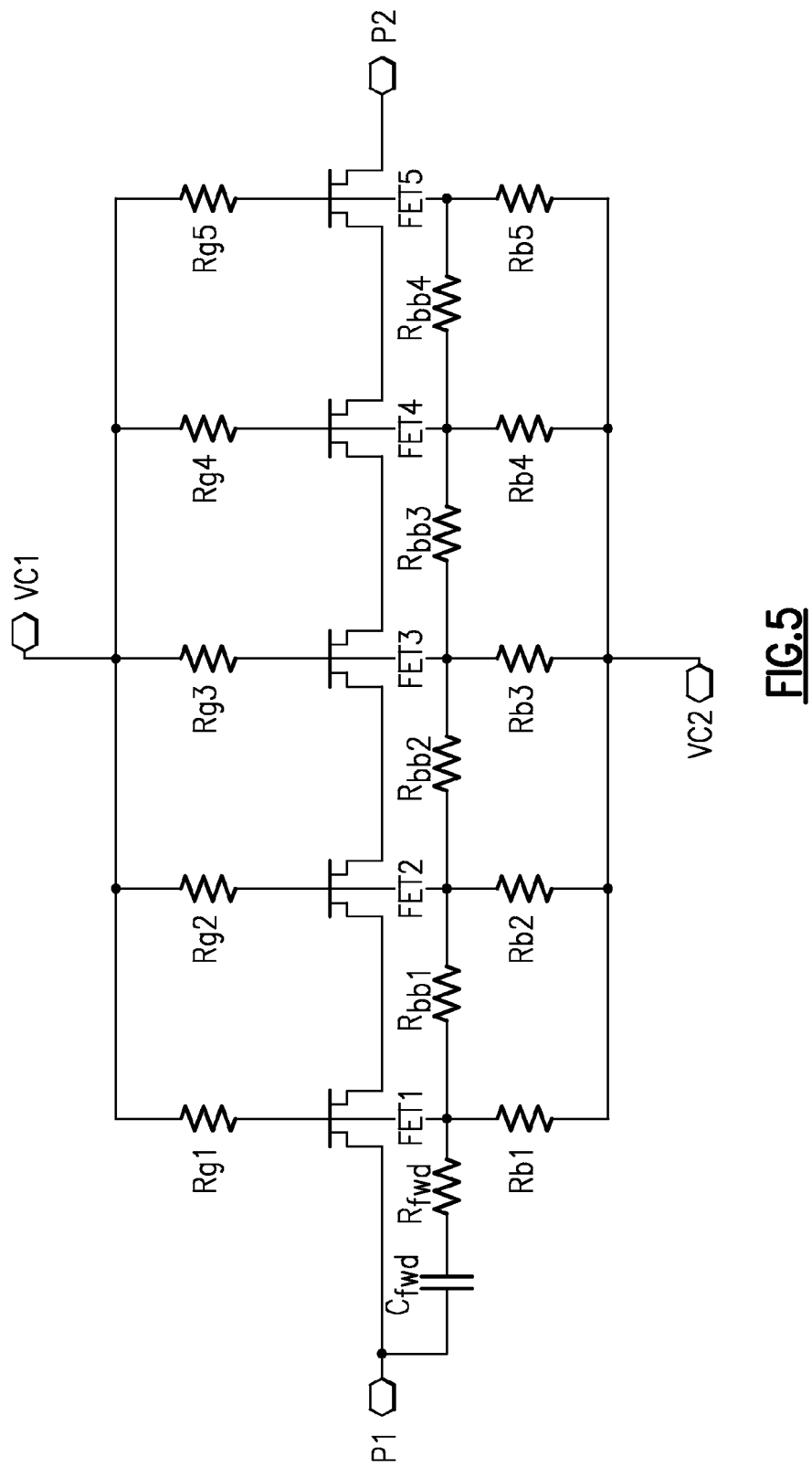
FIG. 5 shows a switching circuit including five FETs connected in series defining an RF signal path between an input end and an output end, and including an implementation of the body node voltage compensation technique.

Referring to FIG. 5, a resistive element Rbb may be coupled to a body node of an FET in an FET stack of a switching circuit to improve device performance. In some embodiments, a resistive element Rbb may be coupled to the body node of each FET in an FET stack to provide increased voltage distribution uniformity across the FET stack of a switching circuit. For example, a switching circuit used in transmission of RF signals at lower frequencies may optionally implement an embodiment of the body node voltage compensation technique where a resistive element Rbb is coupled to the body node of each FET in the FET stack to increase voltage swing uniformity across the FET stack.

Resistance of resistive elements Rbb may be selected to increase uniformity of voltage swing across an FET stack. Resistive elements Rbb coupled to body nodes of FETs in an FET stack of a switching circuit may have distinct resistance values. In some embodiments, the resistive elements Rbb may have resistance values in decreasing order, starting from the resistive element Rbb coupled to a first FET in an FET stack.

For example, as shown in FIG. 5, in some embodiments of a switching circuit having an FET stack of five FETs connected in series, resistive elements Rbb1, Rbb2, Rbb3 and Rbb4 can be coupled to each of the body nodes of FET1, FET2, FET3, FET4 and FET5. To improve uniformity of voltage swing distribution across the FET stack, resistive elements Rbb1, Rbb2, Rbb3 and Rbb4 may also have resistance values in decreasing order, such that the resistance value of Rbb1 is greater than that of Rbb2, and the resistance value of Rbb2 is greater than that of Rbb3, and the resistance value of Rbb3 is greater than that of Rbb4.

Referring to FIG. 5, in some embodiments of the body node voltage compensation technique, a feed-forward resistive element may also be optionally used from the main RF signal path to the body node of the FET stack. Further, in some embodiments of the body node voltage compensation technique where a resistive element Rbb is coupled to a body node of an FET in an FET stack, a feed-forward capacitive element, Cfwd, can be used from the main RF signal path to the body node of the FET stack. The RF signal path may be coupled to the body node through an FET in the FET stack. In some embodiments where both a feed-forward capacitive element and a feed-forward resistive element are implemented, the feed-forward capacitive element may be connected in series with the feed-forward resistive element. Referring to FIG. 5, a feed-forward capacitive element Cfwd connected in series with a feed-forward resistive element can be used to couple the RF signal to the body node of a first FET in an FET stack. In such embodiments, the RF signal path is coupled through the source or drain of the first FET to the body node of the first FET. In the alternative, the RF signal path can be optionally coupled through the source or drain of another FET within the FET stack.

Referring to FIG. 5, in some embodiments of the body node voltage compensation technique where resistive elements Rbb are coupled to the body node of an FET in an FET stack, the switching circuit may also include resistive elements Rb, such as resistive elements Rb1, Rb2, Rb3, Rb4 and Rb5 in FIG. 5, implemented to float the body node of each FET in the FET stack. Meanwhile, resistive elements Rg, such as resistive elements Rg1, Rg2, Rg3, Rg4, Rg5 in FIG. 5, can be implemented to float the gate node of each FET in the FET stack.

Figure 6:
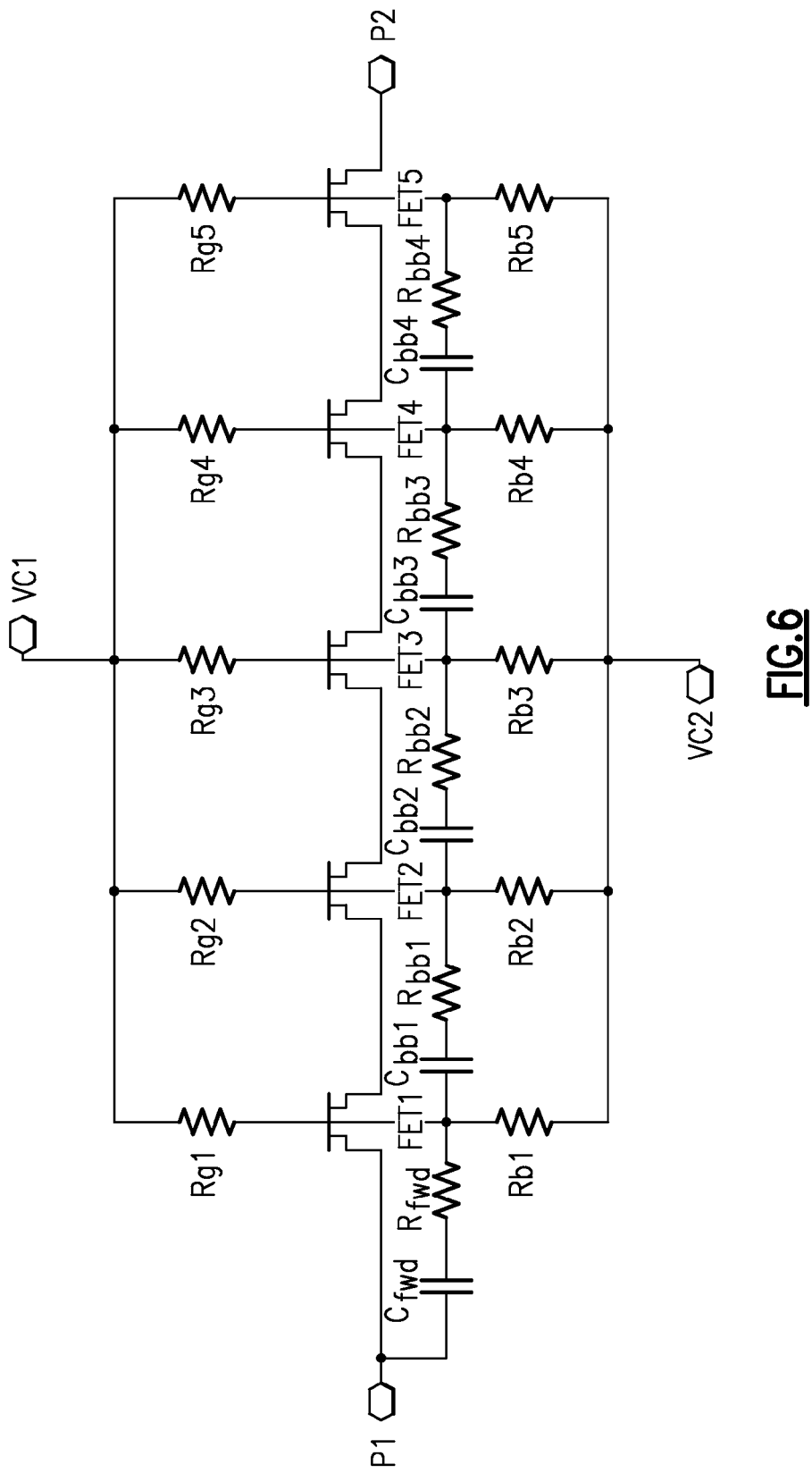
FIG. 6 shows a switching circuit including five FETs connected in series defining an RF signal path between and input end and an output end, and including an implementation of the body node voltage compensation technique.

A switching circuit having a voltage distribution equalizing circuit may implement an embodiment of the body node voltage compensation technique where an FET in an FET stack is coupled to a capacitive element Cbb that is connected in series with a resistive element Rbb. Referring to FIG. 6, an example switching circuit implementing an embodiment of the body node voltage compensation technique may couple the body node of each FET in an FET stack to a capacitive element Cbb that is connected in series with a resistive element Rbb. For example, the body nodes of FET1, FET2, FET3, FET4, and FET5 are respectively coupled to Cbb1 connected in series with Rbb1, Cbb2 connected in series with Rbb2, Cbb3 connected in series with Rbb3, and Cbb4 connected in series with Rbb4.

Referring to FIG. 6, in some embodiments where the body node of an FET in an FET stack is coupled to a capacitive element Cbb that is connected in series with a resistive element Rbb, a feed-forward capacitive element Cfwd can be used from the main RF signal path to the body node of the FET stack. A feed-forward resistive element Rfwd may also be optionally used from the main RF signal path to the body node of the FET stack. In some embodiments where both a feed-forward capacitive element Cfwd and a feed-forward resistive element Rfwd are implemented, the feed-forward capacitive element Cfwd may be connected in series with the feed-forward resistive element Rfwd. Referring to FIG. 6, a feed-forward capacitive element Cfwd connected in series with a feed-forward resistive element Rfwd can be used to couple the RF signal to the body node of a first FET in an FET stack. In such embodiments, the RF signal path is coupled through the source or drain of the first FET to the body node of the first FET within the FET stack. In the alternative, the RF signal path can be optionally coupled through the source or drain of another FET within the FET stack.

Further, as shown in FIG. 6, in some implementations of the body node voltage compensation technique where the body node of an FET in an FET stack is coupled to a capacitive element Cbb that is connected in series with a resistive element Rbb, resistive elements Rb, such as resistive elements Rb1, Rb2, Rb3, Rb4 and Rb5 in FIG. 6, may be implemented to float the body node of each FET in the FET stack. Meanwhile, resistive elements Rg, such as resistive elements Rg1, Rg2, Rg3, Rg4, Rg5 in FIG. 6, can be implemented to float the gate node of each FET in the FET stack.

Figure 7:
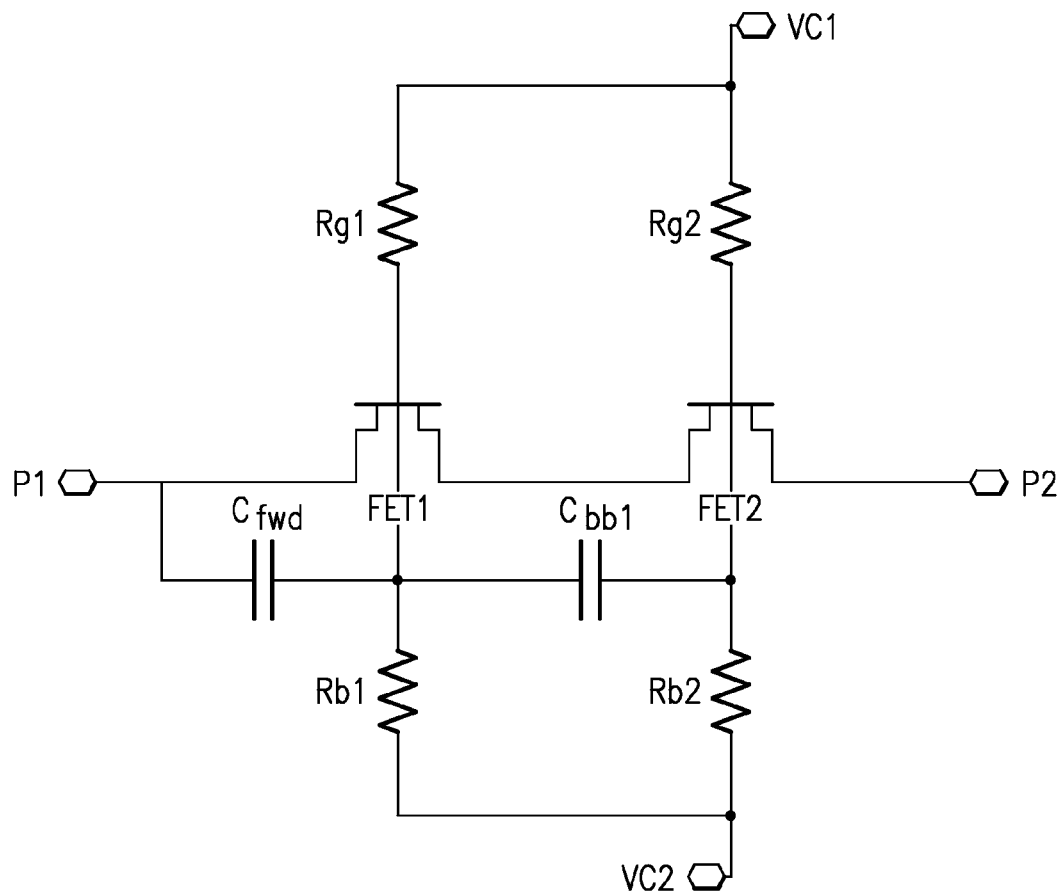
FIG. 7 shows an example switching circuit including two FETs connected in series defining an RF signal path between an input end and an output end, and including an implementation of the body node voltage compensation technique.

The voltage distribution equalizing circuit may be implemented for switching circuits that include varying numbers of FETs in the FET stack. For example, FIG. 7 shows a switching circuit having two FETs, FET1 and FET2. A voltage distribution equalizing circuit including an embodiment of the body node voltage compensation technique having characteristics as discussed herein may be implemented for such a switching circuit. In some embodiments of such a switching circuit, implementation of the body node voltage compensation technique may include a capacitive element Cbb1 coupled to the body nodes of FET1 and FET2. The body node voltage compensation technique of the example switching circuit may further optionally include a feed-forward capacitive element Cfwd coupling the main RF signal path to the body node of an FET in an FET stack, such as the first FET, FET1. Additionally, resistive elements Rb1 and Rb2 may be implemented to float the body nodes of FET1 and FET2 respectively. Meanwhile, resistive elements Rg1 and Rg2 may be implemented to float the gate nodes of FET1 and FET2.

Figure 8:
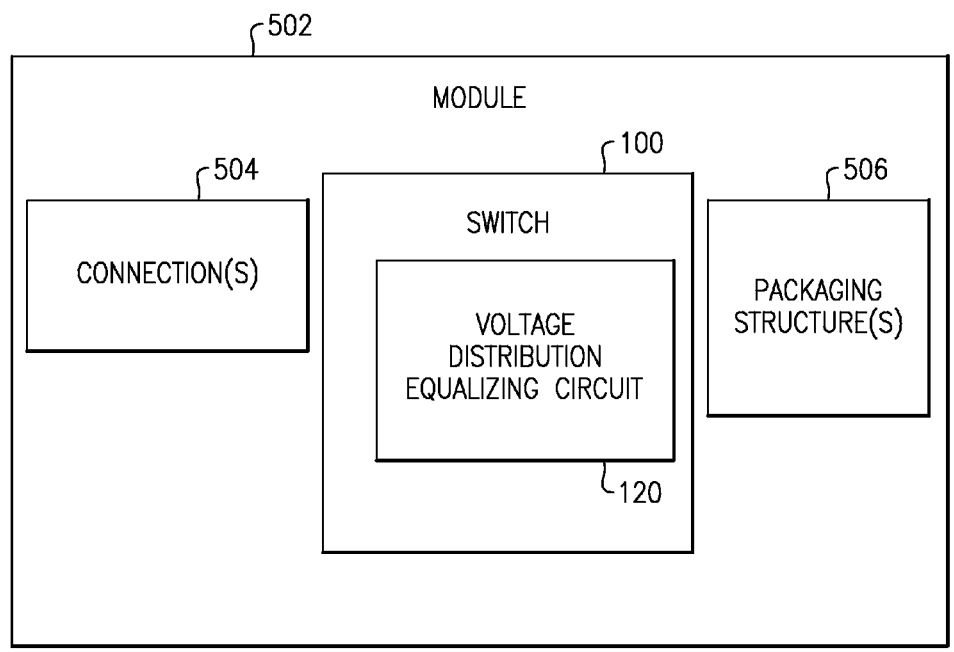
FIG. 8 shows that in some implementations, a voltage distribution equalizing circuit having one or more features as described herein can be part of a switching circuit included in a packaged module.

In some embodiments, as shown in FIG. 8, a switching device 100 having one or more features described herein can be implemented in a packaged module 502. In such embodiments, the switching device 100 can include a switching circuit that implements a voltage distribution equalizing circuit 120 having one or more features as described herein. Such a packaged module 502 can further include one or more connections 504 configured to facilitate passage of signals and/or power to and from the switching device 100. Such a module 502 can further include one or more packaging structures 506 that provide functionality such as protection (e.g., physical, electromagnetic shielding, etc.) for the switching device 100. In some embodiments, the connections 504 can include conductive paths such as bond wires to accommodate wirebond-implementation modules, and/or conductive traces to accommodate flipchip-implementation modules.

Figure 9:
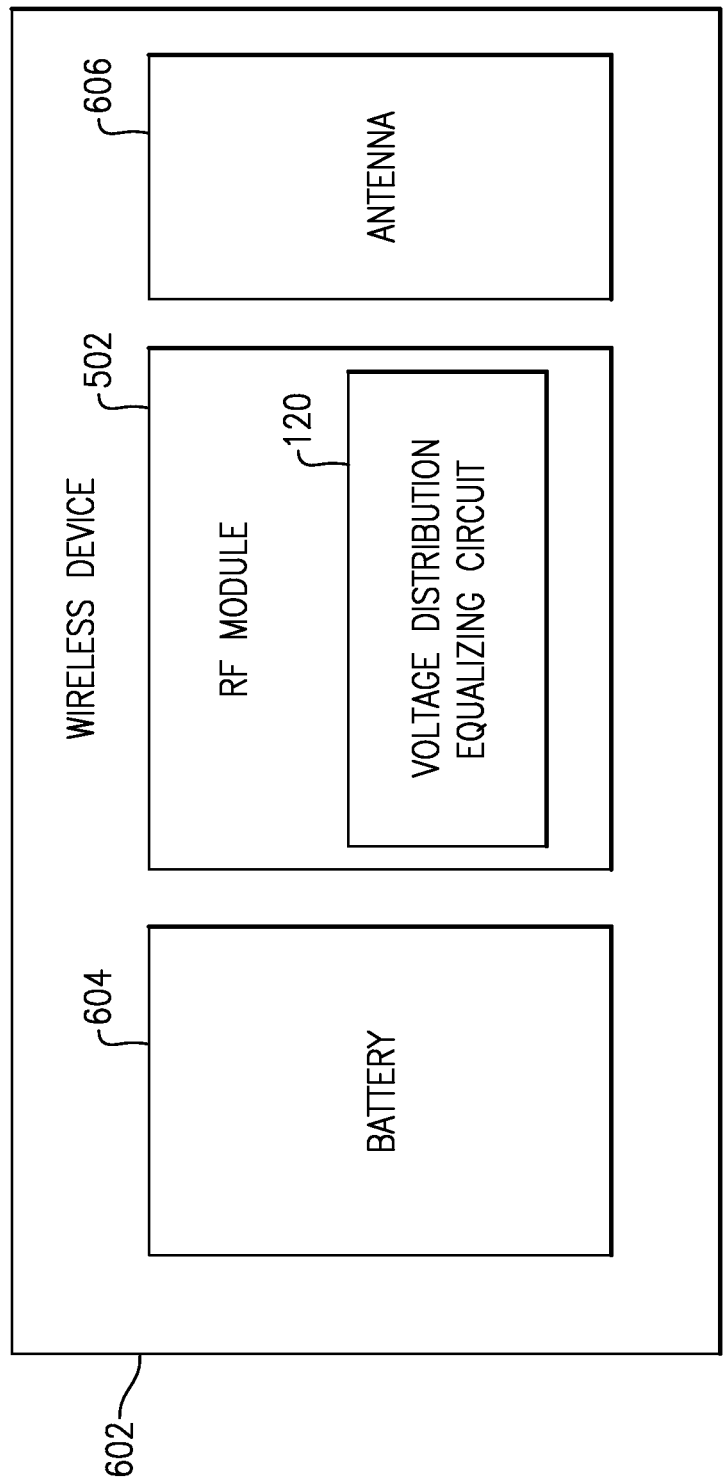
FIG. 9 shows that in some implementations, a voltage distribution equalizing circuit that is part of a packaged module can be part of a wireless device.

FIG. 9 shows that in some embodiments, a component having one or more features described herein can be included in a wireless device 602 such as a cellular phone, a smart phone, etc. In FIG. 9, a packaged switching device module 502 is depicted as being part of the wireless device 602. Such a module 502 is shown to include a voltage distribution equalizing circuit 120 having one or more features as described herein. In some embodiments, an unpackaged switching device 100 having similar functionality can also be utilized to achieve similar functionalities. The wireless device 602 is depicted as including other common components such an antenna 606, and also configured to receive a power source such as a battery 604.

Figure 10:
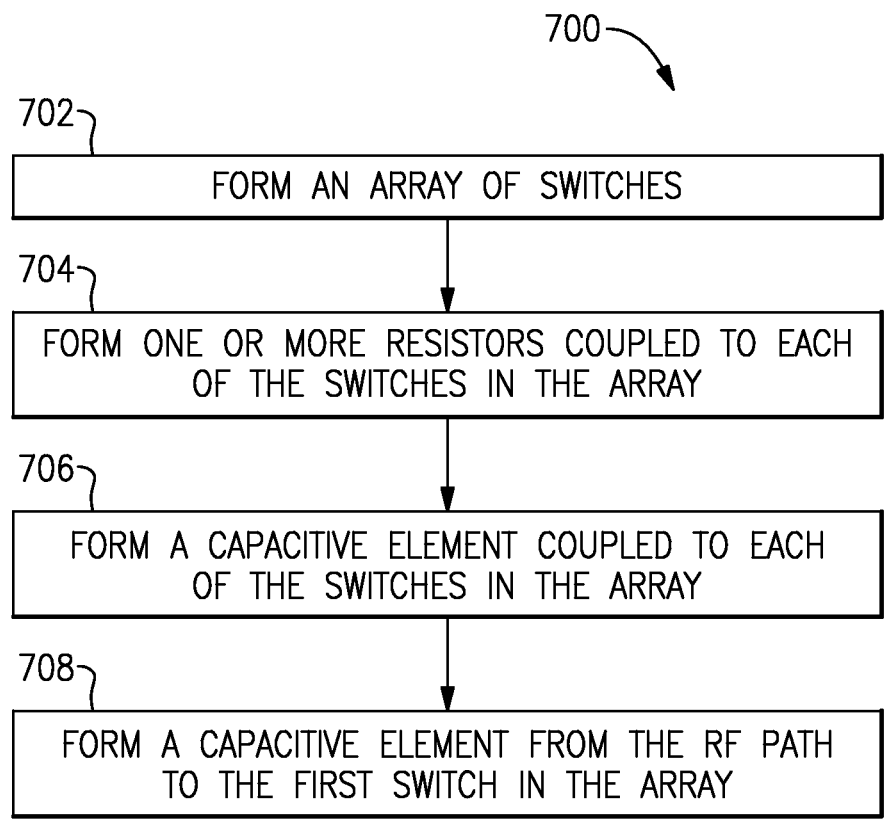
FIG. 10 shows a process that can be applied to fabricate a switching circuit having one or more features as described herein.

FIG. 10 shows a process 700 that can be implemented to fabricate a voltage swing distribution equalizing circuit having one or more features as described herein. In block 702, an array of switches can be formed. In embodiments where the switches are formed on a semiconductor substrate, semiconductor switches such as FETs can be formed on the substrate. In block 704, resistive elements coupled to each of the switches can be formed. In the semiconductor substrate context, resistive elements can be coupled to the body node or gate node of the FETs. As shown in block 706, capacitive elements coupled to the switches can be formed. In the context where switches including FETs are formed on a semiconductor substrate, capacitive elements coupled to the body nodes of FETs can be formed. In block 708, a capacitive element may also be formed from the RF path to a switch in the array. Such a capacitive element may be optionally formed from the RF path to any switch in the array, including the first switch in the array. In some embodiments where the array of switches include FETs formed on a semiconductor substrate, the capacitive element of block 708 can be formed from the source or drain of the first FET to the body node of the first FET.

Figure 11:
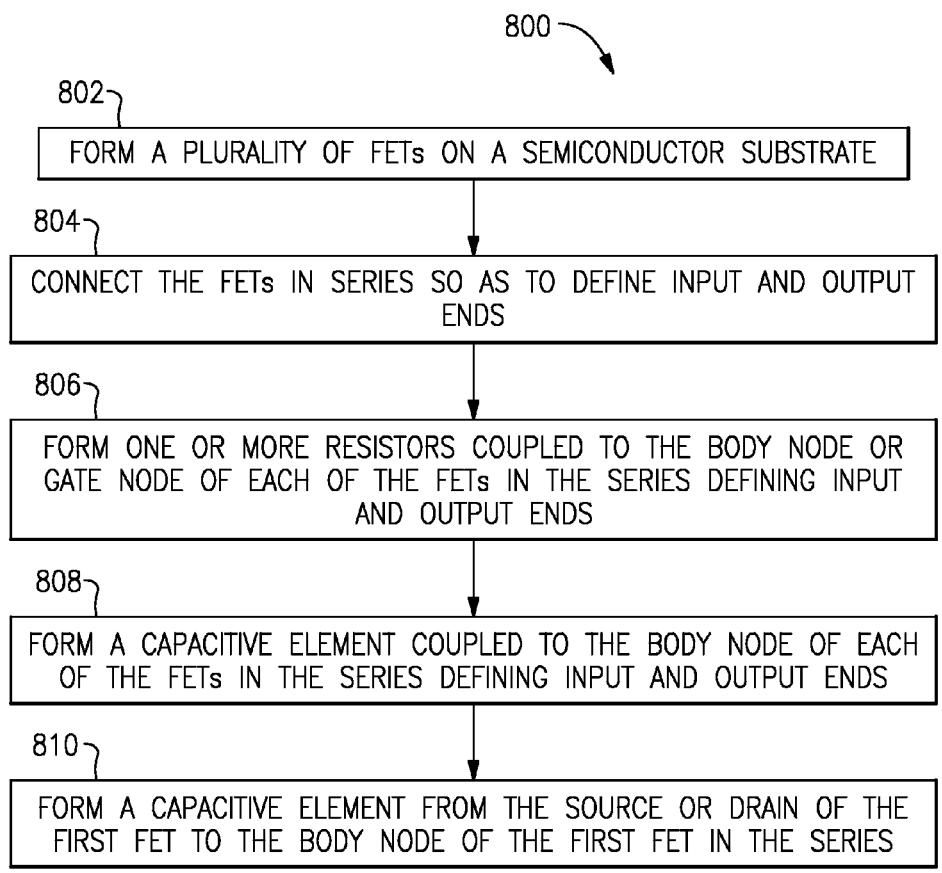
FIG. 11 shows a process that can be applied as a more specific example of the process of FIG. 10.

FIG. 11 shows a process 800 that can be a more specific example of the process shown in FIG. 10. In block 802, a plurality of FETs can be formed on a semiconductor substrate. In block 804, the plurality of FETs can be connected in series so as to define an input end and an output end. In block 806, a resistive element can be coupled to the body node or gate node of each of the FETs in the series defining an input end and an output end. In block 808, a capacitive element coupled to the body node of each of the FETs can be formed. Further, in block 810, a capacitive element can be formed from the source or drain of an FET to the body node of the FET to couple the main RF signal to a body node of an FET. The capacitive element can be optionally formed from the source or drain of the first FET to the body node of the first FET in the series of FETs defining an input end and an output end.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switching circuit, comprising:
   an input port configured to receive a radio-frequency (RF) signal;
   an output port configured to output the RF signal;
   a switch including a first field effect transistor (FET) having a first body node and a second FET having a second body node, the first and second FETs defining an RF signal path between the input port and the output port, the switch configured to be capable of being in first and second states, the first state corresponding to the input and output ports being electrically connected so as to allow passage of the RF signal therebetween, the second state corresponding to the input and output ports being electrically isolated; and
   a voltage distribution circuit configured to reduce voltage distribution variation across the switch, the voltage distribution circuit including a connection path connected between the first body node and the second body node, the connection path including a first resistor and a first capacitor connected in series with the first resistor, the voltage distribution circuit further including a resistive network connected between the first body node and the second body node, the resistive network including a bias node connected between third and of the resistive network.

2. The switching circuit of claim 1 wherein the voltage distribution circuit further includes a feed-forward capacitive element configured to couple the RF signal to the first body node.

3. The switching circuit of claim 2 wherein the feed-forward capacitive element is configured to couple the RF signal to the first body node through a source or drain of the first FET.

4. The switching circuit of claim 1 wherein the voltage distribution circuit further includes a feed-forward capacitive element connected in series to a resistive element and configured to couple the RF signal to the first body node.

5. The switching circuit of claim 1 wherein the voltage distribution circuit further includes a resistive element coupled to a gate node of the first FET to thereby enable floating of the gate node of the FET.

6. A packaged module for a radio-frequency (RF) device, the module comprising:
   a packaging substrate; and
   an integrated circuit (IC) formed on a semiconductor die and mounted on the packaging substrate, the IC including a switch having a first field effect transistor (FET) having a first body node and a second FET having a second body node, the first and second FETs defining an RF signal path between an input port and an output port, the IC further including a voltage distribution circuit coupled to the switch and configured to reduce voltage distribution variation across the switch when the switch is in an ON state and encountered by a respective RF signal at the input port, the voltage distribution circuit including a connection path connected between the first body node and the second body node, the connection path including a first resistor and a first capacitor connected in series with the first resistor, the voltage distribution circuit further including a resistive network connected between the first body node and the second body node, the resistive network including a bias node connected between third and of the resistive network.

7. The packaged module of claim 6 further comprising at least one connection configured to facilitate passage of signals to and from the switch.

8. The packaged module of claim 6 further comprising a packaging structure configured to provide protection for the switch.

* * * * *